United States Patent

Stevens

(10) Patent No.: US 8,542,125 B2
(45) Date of Patent: Sep. 24, 2013

(54) SYSTEM FOR VERIFYING THE INTEGRITY OF AN ELECTRICAL UNION

(75) Inventor: Aaron J. Stevens, Derby (GB)

(73) Assignee: Rolls-Royce PLC, London (GB)

( * ) Notice: Subject to any disclaimer, the term of this patent is extended or adjusted under 35 U.S.C. 154(b) by 259 days.

(21) Appl. No.: 13/143,669

(22) PCT Filed: Jan. 19, 2010

(86) PCT No.: PCT/EP2010/000269
§ 371 (c)(1), (2), (4) Date: Jul. 7, 2011

(87) PCT Pub. No.: WO2010/094377
PCT Pub. Date: Aug. 26, 2010

(65) Prior Publication Data
US 2012/0086577 A1    Apr. 12, 2012

(30) Foreign Application Priority Data

Feb. 17, 2009    (GB) .................................. 0902535.4

(51) Int. Cl.
*G08B 21/00*    (2006.01)
(52) U.S. Cl.
USPC ......................................... 340/635; 340/658
(58) Field of Classification Search
USPC .............. 340/635, 653, 657, 658, 679, 686.1, 340/686.3; 702/117; 73/116.02, 116.03, 73/114.77, 114.78, 114.81, 114.58
See application file for complete search history.

(56) References Cited

U.S. PATENT DOCUMENTS

| 4,502,046 | A | 2/1985 | Wonn et al. |
| 4,563,675 | A | 1/1986 | Miller et al. |
| 7,409,319 | B2 * | 8/2008 | Kant et al. ................. 702/188 |
| 8,115,494 | B2 * | 2/2012 | Franklin ..................... 324/522 |

FOREIGN PATENT DOCUMENTS

| DE | 103 25 389 A1 | 12/2004 |
| FR | 2 548 482 A1 | 1/1985 |

OTHER PUBLICATIONS

Search Report and Written Opinion issued in International Application No. PCT/EP2010/000269 dated May 27, 2010.

* cited by examiner

*Primary Examiner* — Toan N Pham
(74) *Attorney, Agent, or Firm* — Oliff & Berridge, PLC

(57) ABSTRACT

A system is provided for verifying the performance of an electrical union. The electrical union provides electrical connectivity across an interface between first and second elements which rotate relative to each other. The system includes a signal source associated with the first element. The signal source is adapted to send an electrical signal over the union to the second element using a first signal frequency. The system further includes a frequency modulator associated with the second element. The frequency modulator is adapted to return the electrical signal over the union to the first element using a different second signal frequency. The system further includes a comparator which compares the signal sent by the data source to the signal returned by the frequency modulator. The comparator provides an output which identifies whether a discrepancy exists between the contents of the sent and returned signals.

11 Claims, 1 Drawing Sheet

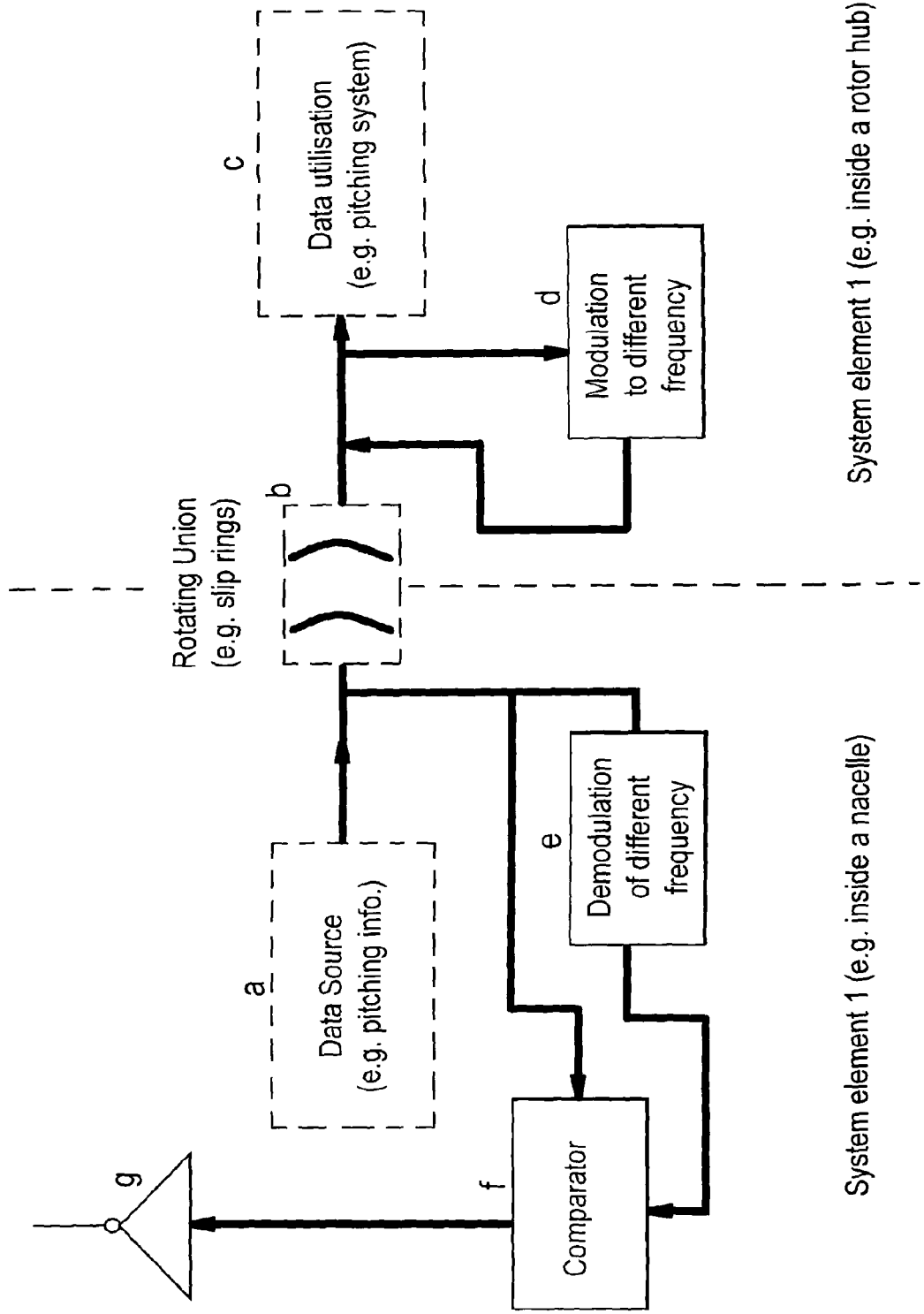

SYSTEM FOR VERIFYING THE INTEGRITY OF AN ELECTRICAL UNION

The present invention relates to a system for verifying the integrity of an electrical union.

Electrical unions, such as slip rings, are commonly used to transfer information and/or power between a rotor and a stator.

Fields of application include, for example:
- power and/or signals from a static wind or tidal turbine nacelle to the rotating hub, e.g. to control and/or power blade pitch
- transmitting information between elements of gas turbines on test rigs
- transmitting information between elements of nuclear power systems
- transferring power between fixed nacelles and rotating propeller blades on an aircraft, e.g. to power blade mounted ice melting heaters.

In many of these applications the performance of the union is safety critical, but the union is a mechanical device subject to wear and tear. Thus, approaches have been developed to detect damage to the union. Most of these approaches focus on identifying physical changes to the union's condition, rather than its ability to perform adequately.

Thus a problem with these approaches is that they rely on a strong correlation between the physical parameter being monitored and the performance of the union. However, performance problems can be experienced with the use of electrical unions which are not always associated with obvious physical symptoms. For example, minute particles of worn slip ring can create noise artefacts, interfering with the communication of data/signals across the ring. Likewise, changes to physical condition sometimes do not result in performance losses, so that the approaches can be susceptible to false positives.

Alternative approaches which have been developed for monitoring performance propose the measurement of characteristics such as current flow across the union, voltage across the union, temperature etc. However, these approaches also do not provide confidence that communication of data/signals across the union is adequate.

The present invention provides an alternative approach to verifying the performance of an electrical union in which the integrity with which signals are transmitted across the union is examined.

Thus, a first aspect of the present invention provides a system for verifying the performance of an electrical union (such as a slip ring) providing electrical connectivity across an interface between first and second elements which rotate relative to each other, the system including:

a signal source associated with the first element, the signal source being adapted to send an electrical signal over the union to the second element using a first signal frequency;

a frequency modulator associated with the second element, the frequency modulator being adapted to return the electrical signal over the union to the first element using a different second signal frequency; and a comparator which compares the signal sent by the data source to the signal returned by the frequency modulator and provides an output which identifies whether a discrepancy exists between the contents of the sent and returned signals.

Thus the system monitors directly a characteristic of the union which is most critical to its correct performance, i.e. its ability to transmit data signals correctly. An advantage of the system is that, unless the output of the comparator identifies a discrepancy, or the comparator itself is malfunctioning, the integrity of data transfer across the union is assured with a high level of confidence. Further, the risk of false positives (i.e. incorrect identification of discrepancies) is low.

By having different frequencies for the sent and returned signals interference between the signals can be avoided. Typically, the sent signal is either sent at its own natural frequency, or alternatively uses a carrier frequency, the data in the signal being encoded in modulations of that frequency. Thus the sent signal can utilise a range of frequencies. In this case, the second frequency of the returned signal should, therefore, be selected such that the range of frequencies in the returned signal is sufficiently spaced from the range of frequencies in the sent signal.

The system can be adapted to verify the performance of a plurality of electrical unions.

Typically, the system has a further frequency modulator which, preliminary to the comparison by the comparator, modulates the frequency of the signal sent by the data source or the frequency of the signal returned by the frequency modulator so that the two signals use the same frequency. For example, the further frequency modulator can demodulate the signal returned by the frequency modulator to revert that signal to the first frequency. This facilitates the comparison of the signals by the comparator.

Preferably, the comparator provides a binary signal output, the value of which depends on whether or not a discrepancy is identified. A binary output facilitates downstream analysis of the output.

The system may further include a condition monitor which monitors the output of the comparator and issues an alert when the pattern of identified discrepancies indicates loss of integrity of the electrical union. The alert can be used to signal replacement or maintenance of the union, or to engage a back up to the union.

Preferably, the electrical union is also adapted to carry electrical power between the first and second elements. As data transfer is generally more sensitive to degradation of the union's condition than power transfer, the integrity of power transfer can also assured by the system.

A second aspect of the present invention provides a combination of the system according to the first aspect and the electrical union (e.g. a slip ring). Indeed, the combination may further include the first and second elements. One of the first and second elements may include an electrical generator, the power generated by the generator being transmitted over the union to the other element. One of the first and second elements may include an electrically-powered device, the power to operate the device being transmitted over the union from the other element.

A further aspect of the present invention provides a method for verifying the performance of an electrical union, the method corresponding to the system and combination of the previous aspects. Thus, the method may include the steps of:

providing an electrical union which provides electrical connectivity across an interface between first and second elements which rotate relative to each other;

sending an electrical signal over the union to the second element using a first signal frequency;

returning the electrical signal over the union to the first element using a different second signal frequency; and comparing the signal sent by the data source to the signal returned by the frequency modulator to identify whether a discrepancy exists between the contents of the sent and returned signals.

The method may further include any one or combination of optional features corresponding to optional features of the system and combination of the previous aspects.

Embodiments of the invention will now be described by way of example with reference to the accompanying drawing in which:

FIG. 1 shows schematically an embodiment of the system in the context a tidal or wind powered turbine.

The present invention concerns a system for verifying the integrity of a rotating electrical union, and particularly for verifying the integrity of data/signal transfer between the two elements at either side of the union, which elements rotate relative to each other. Further, in the event the union is also used to transfer electrical power from one element to the other, verification of the integrity of data/signal transfer can be used as a proxy for verification of the integrity of electrical power flow across the union. This is because data/signal transfer is generally more susceptible to electrical union degradation than power flow.

FIG. 1 shows schematically an embodiment of the system in the context a tidal or wind powered turbine. The turbine has a stationary nacelle 1 attached to a support structure and a hub 2 which rotates relative to and housed within the nacelle. A slip ring b is provided at the rotating interface between the nacelle and the hub. Electrical power is transferred across the slip ring from the nacelle to actuate alterations to the pitch of blades attached to the hub. Electrical control signals are also transferred across the slip ring from the nacelle to control the pitch alteration.

The control signals are sent from a signal source a associated with the nacelle 1. The signal source comprises, for example, a pitching data look-up table which is consulted to generate the signals. The signals pass across the slip ring b and are utilised in the hub 2 by a blade pitching system c. The signals utilise a first frequency in their transmission, this can be their natural frequency (for example the frequency range of the raw data encoded by the signals) or can be in the form of a carrier frequency on which the signals are modulated.

As well as the blade pitching system c, the hub 2 has a frequency modulator b. The signals sent over the slip ring b are also received by the modulator, which modulates the carrier frequency of the signals to a different second frequency well away from the natural frequency or carrier frequency of the initial signals or any variation of that frequency in the initial signal. On exiting from the modulator, the modulated signals return over the union to the nacelle 1.

The returned signals are received in the nacelle by a demodulator e, which is tuned to the same frequency range as the modulator d. The demodulator reverts the returned signals back to the first frequency.

Thus effectively the original signals are "mirrored" across the slip ring b and back. The "mirroring" of the signals does not cause signals travelling from nacelle 1 to hub 2 to interfere with signals travelling from hub 2 to nacelle 1, as the two sets of signals are in different frequency ranges.

Both the original signals and the demodulated signals are sent to a comparator f to identify data/signal transmission errors across the rotating electrical union. Any discrepancy between the original signals and the demodulated signals indicates that data/signals are not passing across the slip ring b from system 1 to system 2 with 100% accuracy. The comparator has a binary output, with logic level 0 indicating its two inputs are not identical. As it is usual for a logic level 1 to flag a particular state, such as an error, an optional inverter g can be used to invert the output of the comparator so that when signals reaching the comparator are identical, the output of the inverter will be 0, and when they are not identical the output of the inverter will be 1.

Although not shown in FIG. 1, the system may also have a condition monitoring module which monitors the output of the comparator. The module compares the pattern of identified discrepancies for departures from normality, and issues an alert when such a departure occurs. A typical method by which the condition monitoring module works, would be to sample the number and duration of errors flagged by the comparator, and to detect emergent patterns in the appearance and/or duration of these errors.

The alert can then be a signal for action, such as replacement or maintenance of the slip ring, or the engagement of a back up system of communications or control across the rotating interface. In particular, in some safety critical applications, such as nuclear power generation, knowing that data/signals have miscommunicated can be a trigger for switching over to a back up system, e.g. to a contingency rotating electrical union.

The system has been described above in relation to a tidal or wind powered turbines. Other fields of application include:
Nuclear systems
Weapons systems
Spacecraft
Engines
Marine control systems
Helicopter rotors
Aeroplane rotors
Hydroelectric turbines
Gas turbine technology
Compressor technology While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A system for verifying performance of an electrical union providing electrical connectivity across an interface between first and second elements which rotate relative to each other, the system including:
    a signal source associated with the first element, the signal source being adapted to send an electrical signal over the union to the second element using a first signal frequency;
    a frequency modulator associated with the second element, the frequency modulator being adapted to return the electrical signal over the union to the first element using a different second signal frequency; and
    a comparator which compares the signal sent by the signal source to the signal returned by the frequency modulator and provides an output which identifies whether a discrepancy exists between the contents of the sent and returned signals.

2. A system according to claim 1 further including:
    a further frequency modulator which, preliminary to the comparison by the comparator, modulates the frequency of the signal sent by the data source or the frequency of the signal returned by the frequency modulator so that the two signals use the same frequency.

3. A system according to claim 2 wherein the further frequency modulator demodulates the signal returned by the frequency modulator to revert that signal to the first frequency.

4. A system according to claim 1 wherein the comparator provides a binary signal output, a value of which depends on whether or not a discrepancy is identified.

5. A system according to claim 1 further including:
a condition monitor which monitors the output of the comparator and issues an alert when a pattern of identified discrepancies indicates loss of integrity of the electrical union.

6. A combination of the system according to claim 1 and the electrical union.

7. A combination according to claim 6, wherein the electrical union is adapted to carry electrical power between the first and second elements.

8. A combination according to claim 6, wherein the electrical union is a slip ring.

9. A combination according to claim 6, including the first and second elements.

10. A combination according to claim 9 wherein one of the first and second elements includes an electrical generator, power generated by the generator being transmitted over the union to the other element.

11. A combination according to claim 9 wherein one of the first and second elements includes an electrically-powered device, power to operate the device being transmitted over the union from the other element.

\* \* \* \* \*